United States Patent [19]

Engelken et al.

[11] Patent Number: 4,681,777

[45] Date of Patent: Jul. 21, 1987

[54] METHOD FOR ELECTROLESS AND VAPOR DEPOSITION OF THIN FILMS OF THREE TIN SULFIDE PHASES ON CONDUCTIVE AND NONCONDUCTIVE SUBSTRATES

[76] Inventors: Robert D. Engelken, 304 Easy St.; Hal E. McCloud, 2011 Emerald St., both of Jonesboro, Ark. 72401

[21] Appl. No.: 859,927

[22] Filed: May 5, 1986

[51] Int. Cl.[4] .............................................. B05D 5/12
[52] U.S. Cl. ...................................... 427/87; 427/92; 427/98; 427/99; 427/126.1; 427/255.2; 427/255.5; 427/437; 427/443.1; 423/565
[58] Field of Search .................. 427/84, 86, 87, 92, 427/255.1, 255.2, 255.5, 283, 304, 98, 99, 126.1, 437, 443.1, 419.7; 423/565, 561 R

[56] References Cited

U.S. PATENT DOCUMENTS

| | | | |
|---|---|---|---|
| 2,585,161 | 2/1952 | Muskat et al. | 423/565 |
| 2,757,104 | 7/1956 | Howes | 427/103 |
| 3,063,850 | 11/1962 | Mikulski | 106/1 |
| 4,027,055 | 5/1977 | Schneble, Jr. | 427/98 |

OTHER PUBLICATIONS

Molenaar, A. et al., "Autocatalytic Tin Deposition", Surface Technol., vol. 16, (1982), pp. 265–275.
Molenaar, A., "Autocatalytic Deposition of Gold and Tin", Extended Abstracts of the Electrochemical Society, abstract No. 442, Fall Meeting, Oct. 1984.
Chopra, K. L. et al., "Chemical Solution Deposition of Inorganic Films", Physics of Thin Films, vol. 12, (1982), pp. 167–235.
Chopra, K. L. et al., "Thin Film Deposition Techniques", Thin Film Solar Cells, Plenum Press, New York, (1983), pp. 240–256.
Kern, W. et al., "Chemical Vapor Deposition of Inorganic Thin Films", Thin Film Processes, Academic Press, New York, (1978), pp. 257–331.

*Primary Examiner*—Sam Silverberg
*Assistant Examiner*—Terry J. Owens
*Attorney, Agent, or Firm*—John J. Mulrooney

[57] ABSTRACT

The present invention relates to a method for electroless and vapor deposition of thin films of one, two and/or three semiconducting tin sulfide phases (SnS, $Sn_2S_3$, and/or $SnS_2$) by below-solution electroless plating and/or above-solution self-induced chemical vapor deposition onto both nonconductive and conductive substrates from a chemical bath containing an organic acid, Sn(II) salt, elemental yellow sulfur and water.

22 Claims, No Drawings

METHOD FOR ELECTROLESS AND VAPOR DEPOSITION OF THIN FILMS OF THREE TIN SULFIDE PHASES ON CONDUCTIVE AND NONCONDUCTIVE SUBSTRATES

The present invention relates to deposition of thin films of one, two, and/or three semiconducting tin sulfide phases ($SnS$, $Sn_2S_3$, and/or $SnS_2$) by below-solution electroless plating and/or above-solution self-induced chemical vapor deposition onto both nonconductive and conductive substrates from a chemical bath of an organic acid, $Sn(II)$, elemental yellow sulfur, and water.

BACKGROUND OF THE INVENTION AND DESCRIPTION OF THE PRIOR ART

Methods for electroplating metallic tin coatings onto electrically conductive coatings have been well known in the art for many years. Immersion plating of metallic tin onto metallic substrates by ion displacement of tin ions for the parent metal atoms is also a common industrial process. The book by F. A. Lowenheim (*Modern Electroplating*, The Electrochemical Society, Inc., Pennington, N.J.) provides an in-depth survey of both techniques and an extensive list of pertinent references and patents.

Although the mechanisms for true electroless plating of tin onto nonconductive substrates have been reported (e.g. (1) U.S. Pat. No. 3,063,850 to Mikulski; (2) M. E. Warwick and B. J. Shirley, Trans. Inst. Met. Finish, 58,9 (1980), (3) A. Molenaar and J. J. C. Coumans, Surf. Tech., 16,265 (1982), (4), A. Molenaar, Extended Abstracts, Vol. 84-2, The Electrochemical Society, Pennington, N.J., 634 (1984), and (5) H. M. Van Noort et al., J. Electrochem. Soc. 133,263 (1986)), the quality and reproducibility of the films are often poor and appear to arise from the self-catalyzed reaction $$2\,Sn(II)_{(aq)} = Sn(IV)_{(aq)} + Sn(0)_s$$

since other reducing agents are not required (but may participate to some extent; e.g. V(II), Cr(II)). The use of Sn(II), notably $SnCl_2$, as a sensitizing/catalyzing agent in electroless deposition of other electropositive metals such as palladium is also standard practice (e.g. U.S. Pat. No. 4,554,182 to Bupp et al., and prior art cited therein), but is not directly related to Sn(0) thin film formation.

Electroless deposition of nonmetallic semiconducting or insulating compounds, especially metal sulfides and selenides, has been reported in the literature (e.g. (1) P. Pramanik and S. Biswas, J. Electrochem. Soc., 133,350 (1986), (2) S. Biswas, et al., J. Electrochem. Soc., 133,48 (1986), (3) R. A. Boudreau and R. D. Rauh, J. Electrochem. Soc., 130, 513 (1983), (4) R. N. Bhattacharya and P. Pramanik, J. Electrochem. Soc., 129,332 (1982), and (5) K. L. Chopra et al., *Physics of Thin Films-Vol. 12*, Academic Press (1982), and references contained therein.) In all cases, the nonmetal (S, Se)=X reagent is a S or Se-containing compound in which S,Se exists in the anionic state and which slowly decomposes/disproportionates into $S^=$ or $Se^=$ without involvment of reducing agents or catalysts. The metal chalcogenide film is formed by precipitation of these generated chalcogenide anions and metal cations released by the slow disproportionation of metal complexes (chelates). This precipitation is energetically favored on solid surfaces that provide a bounty of nucleation sites. The continuous and very slow precipitation of these ions, when the $M_xX_y$ solubility product is exceeded, leads to growth of macroscopic films with thickness of order of 0.1–1 $\mu$m.). The technique (e.g. Reference 5 above) appears applicable to nearly all metal chalcogenides in which the metal has a chelate that can slowly release free metal cations.

Major disadvantages of prior art electroless compound plating include (1) The use of relatively expensive and normally toxic sulfur/selenium compounds where $X^=$ already exists as a branch of the molecule, (2) Slow deposition rates and small terminal film thicknesses due to the slow formation of $X^=$ ions, (3) Tendency toward amorphous film formation due to the low growth rates, and (4) The requirement of careful control of pH and metal ion complexing agents.

Weakly adsorbed films of collodial particles of metal compounds can be produced by the method described in S. M. Kulifay, Am. Chem. Soc., 23,4916 (1961) in which metal cations (e.g. $Te^{+4}$, $HSeO_3^-$, $AsO_3^-$, $SbO^+$) of the "nonmetals" tellurium, selenium, arsenic, or antimony, and strong reducing agents such as hydrazine ($N_2H_4$), methanol, etc. are dissolved in aqueous solutions and heated. The separate reducing agent reduces both the metal and nonmetal ions to solid particles which subsequently react to form $M_xX_y$ particles which can stick/adsorb (not nucleate onto) to solid surfaces.

Small numbers of nonmetal anions (e.g. $Te^=$) may be directly generated by the strongly favored electron transfer from the reducing agent to the electropositive nonmetal ion (e.g. $HTeO_2^+$). In this case, the precipitation/nucleation reaction can again occur directly on the solid surfaces $$\text{(e.g. } Cd^{++}_{(aq)} + Te^=_{(aq)} = CdTe(s)\text{)}.$$

Experiment has shown that most of the reactants form powder suspended in solution.

This method is not satisfactory for producing adherent, strong deposits. Major disadvantages include (1) Requirement of a separate, strong, and usually toxic/flammable/explosive chemical reducing agent (e.g. $N_2H_4$, $CH_3OH$), and (2) Film formation only by adhesion/occlusion of colloidal particles formed in the solution and not by true ion/ion condensation and nucleation and, thus, very weak and nonuniform films.

Chemical vapor deposition, another standard, common-knowledge technique of producing compound/alloy films, involves the reaction of multiple gases or vapors containing the film elements on the surface of a heated substrate. These compressed, ultrapure gases are fed into an evacuated or inert reaction chamber via expensive, corrosion-resistant, and fail-safe plumbing connected, through appropriate controls, to purchased cylinders. Normally, these gases are extremely toxic and expensive. For example, arsine ($AsH_3$) and trimethylgallium (($CH_3)Ga$) can be simultaneously fed into a chamber where they react on a hot (700° C.) substrate according to $$AsH_3 + (CH_3)_3Ga = GaAs + 3CH_4.$$

The books by Chopra and Das (*Thin Film Solar Cells*, Plenum Press, New York, 240–256 (1983)) and Vossen and Derr (*Thin Film Processes*, Academic Press, New York (1978)), and references therein, include surveys of the state of the art in chemical vapor deposition as well as other thin film deposition techniques. Major disadvantages in the prior art of chemical vapor deposition include (1) The very high (several hundred °C.) temperatures normally required to activate the chemical reactions, (2) The use of externally stored and fed toxic/corrosive gases, and associated safety problems, (3) The required extreme purity of the gases, (4) Need for evacuation or inert gas flooding of the reaction chamber, and (5) The great expense of the process due to (1) through (4).

By spraying a fine mist of solutions of strong reducing agents and metal/nonmetal salts onto hot (T 300°–700° C.) substrates, the solvent is nearly instantaneously vaporized and the chemical reduction of the salts to the elements and their subsequent reaction to form the compound are strongly enhanced due to the temperature. The resultant films are much more adherent, uniform, and crystalline than in the wet bath procedure of Kulifay. However, in addition to the disadvantages listed under Kulifay, this apparatus includes a pressurized solution vessel, chemical tubing, inert gas propellant, heater etc., all relatively expensive. The book by Chopra et al., (*Physics of Thin Films-Vol.* 12, Academic Press (1982)) reviews this "spray pyrolysis" procedure. Hill and Chamberelin (U.S. Pat. No. 3,148,084) were pioneers in this area.

Schneble (U.S. Pat. No. 4,027,055) discloses a method for depositing smooth and easily solderable tin metal coatings onto metallized surfaces from aqueous baths containing a soluble stannous salt, a sulfur component which comprises a mixture of alkali metal polysulfides and at least one other sulfur-containing compound, a mineral acid, and a wetting agent. The technique is basically an ion displacement/cementation (immersion) process where the metal substrate provides the electrons required for $Sn^{++}$ reduction. It does not work on nonconductive substrates. Schneble found that polysulfide ions ($S_x^=$) generated via disproportionation of the added sulfur compounds (e.g. thiourea) were necessary to produce high quality tin films. Quite likely, $S_x^=$ x=simply complexed $Sn^{++}$ and, hence, slowed down the ion displacement rate, served as a surface blocking agent (brightener), and produced bright, smooth deposits, as is commonly found with complexing/brightening agents during electro- or electroless deposition of metals.

Schneble did observe pale green and coffee colors upon heating his solutions, probably due to formation of $SnS_2^=_{(aq)}$ and $SnS_{(s)}$, respectively, within the solution. He speculates that the coffee color is believed to be due to the formation of a precipitate, stannous sulfide. "The precipitate will do-deposit on any parts being plated during the transitional period, causing grey-black deposits and occasionally a rust-colored dusty deposit. These deposits can easily be removed by a light brushing of the part with water." Evidently these so-called "deposits" are simply adhesions/occlusions of the precipitate easily predicted to be formed within the bath and not a true adherent deposit. Furthermore, Schneble makes it more than clear that this SnS formation is not desirable to his process and discusses ways to avoid or circumvent it. He does not mention $Sn_xS$ formation and does not discuss the controlled formation of other $Sn_xS$ phases and associated multiple layer devices. Furthermore, he, in all cases, utilized sulfur compounds in aqueous solutions and nowhere mentions elemental sulfur molecularly dissolved in predominantly organic acid solutions.

Howes (U.S. Pat. No. 2,757,104) discusses a process to form electrical resistors from alloy films of predetermined and predictable electrical characteristics. The process involves deposition of a "primary" metallic film onto a substrate by any suitable method (electroless deposition, spraying, evaporation or sputtering). The precision alloy is formed by submerging the primary film in a bath containing more electropositive ions of another metal. These ions exchange for atoms of the primary film by ion displacement and electron exchange. This exchange will shift the open circuit voltage of the films positively until the Nernst potentials of the primary film and ion elements become equal and the process ceases. This should correspond to a well defined composition and, hence, resistivity. Subsequent annealing can stabilize and oxidize the films, producing higher resistivity metal oxide resistors.

Howes' process is an ion exchange process dependent upon the pre-existence of a primary metal film. The alloy can not be deposited on a nonconductive substrate in a single step due to this requirement. The ion exchange reaction requires ions more electropositive than the primary film. Howes specifies silver as the primary film and this restricts the ions to those of nobler but often expensive elements such as palladium. Howes makes no mention of tin metal or tin sulfide formation. Since sulfur has no simple ionic cations capable of undergoing this ion exchange, metal sulfides can not be formed.

Byatt (U.S. Pat. No. 4,375,125) discusses the formation of a semi-insulating, passivating metal oxide, metal chalcogenide, or silicon layer on pre-existent p-n junctions (notably silicon) by "generic" chemical conversion treatments (nonspecific). This patent teaches one of a multitude of applications of metal chalcogenides and one of a multitude of ways to improve p-n junction electrical characteristics, but does not deal specifically with improvement in the art of metal chalcogenide, notably $Sn_xS$, film deposition or the creation of p-n junction themselves from metal chalcogenides such as $Sn_xS$.

SUMMARY OF THE INVENTION

The present invention relates to a novel wet bath, chemical technique to inexpensively and rapidly deposit, in very adherent, relatively uniform, and thick form, both within and above the solution, and onto both conductive and nonconductive substrates, $Sn_xS$ films ($0.5 \leq x \leq 1$) at temperatures less than 150° C. from low pH and relatively nontoxic organic acid solutions containing only low cost, elemental sulfur, dissolved with large solubilities in molecular form, optional trace amounts of $H_2O$, simple tin salts such as $SnCl_2$, and optional $Sn^{++}$ complexing agents such as tartaric acid, potassium gluconate, etc. without the need for separate reducing agents, bottled gases, or complex, expensive apparatus. The $H_2O$ and complexing agent concentrations determine how fast and which of the three chemically related but electronically and optically different $Sn_xS$ semiconducting compounds: (1) gray-black p-SnS, (2) brown-amber $Sn_2S_3$, and (3) golden n-$SnS_2$, are deposited. The existence of both p and n compounds in the same chemical system (Sn-S) and the controlled deposition of either or both of these both within the solution by electroless deposition and above the solution by self-induced chemical vapor deposition, by control of the H₂O and complexing ion concentrations and temperature cycle, allow many possible (but not limited to) optical, electronic, decorative, and protective applications of single $Sn_xS$ layers/regions and fabrication of p-SnS/n-SnS$_{2-x}$p-n junctions or other multiple layer/region devices onto both conductive and nonconductive substrates from the same or sequential baths via simple thermal activation of the bath.

It is an object of the present invention to provide an electroless (chemical bath) process for the deposition of uniform, adherent, and thick (up to ten's of microns) films of the three tin sulfide phases, grey-black SnS, brown $Sn_2S_3$, and amber-yellow $SnS_{2-x}$, at temperatures below 150° C. from baths of an organic acid, Sn(II) salts, elemental yellow sulphur, and optional complexing agents and/or water onto either conductive or nonconductive substrates.

It is a further object of the present invention to provide a new process for the electroless (chemical bath) deposition of thin tin sulfide films using a nontoxic chemical bath.

It is a further object of the present invention to provide an acidic solution in which elemental yellow sulfur is soluble in large concentrates (>0.1M) in nonionized, molecular form.

It is a further object of the present invention to provide a new process for an electroless deposition of tin sulfide which requires no separate reducing agent, and wherein the tin (II) ions serve both as the metal source and the reducing agent.

It is a further object of the present invention to provide a new process of electroless (chemical bath) deposition having the capacity to deposit three different tin sulfide semiconductor compounds of similiar chemical composition but substantially different electrical and optical characteristics from the same basic chemical bath type by slight variations in water or complexing agent additions.

It is a further object of the present invention to provide a new process for electroless (chemical bath) deposition which is temperature activated and controlled.

It is a further object of the present invention to provide a method for improving the smoothness and uniformity of the said $Sn_xS$ deposits by prolonged immersion in the bath and slow dissolution and renucleation of defects of large surface area.

It is a further object of the present invention to provide a new process for the deposition of multiple layer structures onto the same substrate from identical or similiar chemical baths by use of successive water or complexing agent additions, such as the formation of p-SnS/n-SnS₂ or p-SnS/n-Sn₂S₃ heterojunctions and metal/Sn$_x$S Schottky Barriers.

It is a further object of the present invention to provide a method for depositing multiple layer thin film structures or mosaic-like thin film structures by a combination of a chemical bath (below-solution) deposition and vapor (above-solution) deposition.

It is a further object of the present invention to provide a new process for the low temperature chemical vapor deposition of tin sulfide phase (SnS, Sn₂S₃ and SnS₂) thin films on conducting or nonconducting substrates.

It is a further object of the present invention to provide a new process for the chemical vapor (above-solution) deposition of grey-black SnS, brown Sn₂S₃, and golden SnS₂ thin films on any solid surface above a chemical bath solution due to reaction/disproportionation of volatile tin and sulfur species generated in-situ in the chemical bath solution.

It is a further object of the present invention to provide a new process for direct fabrication of electronic/photovoltaic p-n junctions and metal-semiconductor junctions (Schottky Barriers) based upon thin films of p-SnS, Sn₂S₃, and/or n-SnS₂ deposited by low temperature chemical bath (electroless) or chemical vapor deposition from baths of Sn(II), sulfur, organic acid, and the following optional ingredients: complexing agents, and water.

It is a further object of the present invention to provide a new process for producing multiple layers of various semiconductor tin sulfide compounds such as, for example, Sn/p-SnS, p-SnS/n-SnS₂ and p-SnS/n-Sn₂S₃.

DESCRIPTION OF THE PREFERRED EMBODIMENTS

According to a preferred embodiment of the present invention, a chemical bath is prepared by mixing Sn(II) salts such SnCl₂ and elemental sulfur powder with organic acids such as acetic, propionic and butyric. As explained hereinafter, complexing agents such as potassium gluconate and tartaric acid, and water may be added. Stirring of the mixture aids in the dissolution of the chemicals. The temperature of the bath is raised above 90° C. at which point abrupt changes occur in the solution color from clear to black, brown or amber, depending upon the concentration of Sn(II) ions, sulfur, water, and complexing agent, and one or more of the tin sulfide phases, SnS (gray-black), Sn₂S₃ (brown) or SnS₂-x (amber) deposit below the solution-air interface in adherent thin film form on a substrate and other objects in the solution.

The principles believed to be involved in the deposition process are that free Sn(II) ions either (1) reduce molecularly dissolved sulfur according to the general reaction

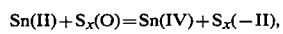

$$Sn(II) + S_x(O) = Sn(IV) + S_x(-II),$$

after which $S_x(-II)$ combines both with Sn(II) and Sn(IV) ions preferentially on solid surfaces (due to large number of nucleation sites) to form SnS, Sn₂S₃ and/or SnS₂ because the solubility products of Sn(II, IV) and S(-II) are exceeded due to the relatively large number of free Sn(II) in solution; or, less likely, (2) disproportionate simultaneously into Sn(IV) and tin metal which nucleates on the solid surfaces and subsequently reacts with dissolved sulfur to form the compound(s).

EXAMPLE A

The following example exemplifies the gist of the process and is set forth for illustration purposes only.

1. To 50 ml propionic acid-H₂O solution (19:1) are added glass slides, and SnCl₂ and yellow sulfur in weights equivalent to 0.3M and 0.6M, respectively. The slides sit near vertically against the beaker walls. The solution is stirred rapidly and heated on a stirring hot plate with Teflon-coated stir bar. Near 50° C., residual undissolved SnCl₂ looks dark. A very faint brownish above-solution vapor deposit was noted near 45° C. (3 minutes after initial heating).

2. After 4 more minutes, the heater was turned up; T=47.5° C. The solution is just slightly "murkey". The brown above-solution vapor deposit is spreading.

3. After 2 more minutes, T=67° C. and is increasing rapidly.

4 After 1 more minute, T=89° C. and much sulfur is dissolved. The brown above-solution deposit is spreading and thickening, and a black vapor deposit appears ⅛ inch above the solution.

5. After 3 more minutes, the solution rapidly turns opaque brown/black and is beginning to boil; T=100° C. The vapor deposit is still spreading.

6. After 2 more minutes, the beaker walls below the solution are brown and solution appears black. Much of the vapor deposit is turning yellow. The heat is turned off.

7. After 3 more minutes, T=90° C. and is falling. A lot of black vapor deposit appears on one slide.

8. After 3 more minutes, T=83° C. and is rapidly falling. The solution is dark brown and thick.

Upon removing and rinsing the slides, the below-solution, electroless deposits are smooth, uniform, thick, adherent, and black. The thick above-solution deposit has black, brown, and yellow regions but is not completely uniform. The below-solution deposits exhibited pronounced $Sn_1S$ X-ray diffraction structure and had a Sn:S ratio near 1:1. The above-solution deposit is a mixture of $Sn_{1+x}S$ (black), $Sn_2S_3$ (brown), and $SnS_{2-x}$ (yellow). The below-solution deposit exhibite ~1 μm.

Experimental observations show that the chemical bath solution abruptly changes color between 80° C. and 110° C., usually near 90° C. which is considered to be the high temperature required to turn on the bath. The color change is due to formation of $Sn_xS$ and $SnS_{2,3(lip.)}$= species within the solution, because of S= formation and subsequent precipitation with Sn(II, IV) due to the reducing nature of Sn(II). A low pH of the bath is an inherent result of the organic acids used, it appearing that pH below 7 would work well due to free $Sn^{++}$ present, but generally pH is in the 0-2 range. It is recognized that the inclusion of relatively inert, non-acidic organic solvents (e.g. propyleneglycol) to the bath would raise the pH without a substantial sacrifice in sulfur solubility. Absolute and relative concentrations of the $SnCl_2$ and sulfur are not critical as long they are reasonably large (>0.01M) and of the same order of magnitude. Generally, 0.1-0.5M concentrations are used for both. Lower concentration values produce deposition, but at much slower rates, and thinner, less uniform deposits. To effectively "tie up" the free $Sn^{++}$ and slow the process, the complexing agent must be present with a molarity comparable to that of the $Sn^{++}$.

Once "activiated", the deposition has little dependence upon subsequent heating or cooling. Thus, the heat is generally turned off after the pronounced bath color change near 90° C. However, the cooling of the solution is not necessary and film formation occurs, with no notable difference, even when the elevated temperature is maintained.

The water content of the solution is believed to control the dissociation of the acid, tin salt and tin complexing agent. An absence of water allows little ionization of the organic acid molecules and the $Sn^{++}$ stays linked to propionate, acetate, or other ions so the rate of $S_x^=$, $HS^-$, or $H_2S$ formation from the $Sn(II)+S(O)=Sn(IV)+S(-II)$ is slowed and, thus, the rate of precipitation of both Sn(II) and Sn(IV) ions with S(-II), which causes nucleation and deposition, is also slowed.

Rapid stirring of the solution isn't mandatory, but is desirable to enhance the homogeneity of the reaction and the uniformity of the deposits.

Experimental observations disclose that substrates positioned vertically within the solution are more uniformly coated than are substrates which are positioned horizontally.

The ingredients of the chemical bath solution may be present in the following ranges of concentration based upon the total bath composition:

| Ingredient | Concentrations |
| --- | --- |
| Sn(II) salt | 0.01 M-to saturation |
| Elemental sulfur | 0.01 M-to saturation |
| Tin Complexing Agent | ~Sn(II) concentration (optional) |
| Organic Acid | 50%-100% |
| Water | 50%-0% (usually <10%) (optional) |

The Sn(II) ions serve as a metal source and reduce molecularly dissolved S(O) to S(-II). The elemental sulfur serves as the sulfur source and a safe, inexpensive free reagent for S(-II) formation, and the tin complex (chelating) agents tie up $Sn^{++}$ ions and slow the rate at which they reduce sulfur to S(-II) and subsequent precipitation with Sn(II) and Sn(IV) ions, leading to slower deposition rates and thinner deposits. The organic acid provides a very large elemental sulfur solubility and sufficient free $H^+$ to keep $Sn^{++}$ relatively free (except when deliverately tied up). The water (when present) enhances the acid ionization and lowers the pH; experimentally, the presence of water is found to be the key stoichiometry-controlling factor; it may assist $H_2S$ formation which aids in thin film deposition. The Sn(II) salts, sulfur, and organic acid components are essential. The water and complexing agents may be essential in some cases to control the stoichiometry and, hence, the electrical and optical properties of the thin film deposits. Any easily ionized Sn(II) salt will suffice. Heavy salts of Sn(II) are considered chelated and, again, lead to slow and thin depositions. There are a large number of possible complexing agents, for example, sodium, potassium, $H^+$, or $NH_4^+$: citrate, tartrate, gluconate, glycolate, EDTA, and lactate. Most would suffice, but the different ionization constants would slightly vary the rate of deposition and, thus, possibly the stoichiometry and thickness of the deposit. Of the light weight organic acids, for example, acetic, propionic and butyric, will suffice. It is also likely that appropriate mixtures of mineral acids and nonacidic organic solvents, for example, HCl in propylene glycol, could be made to perform the same function.

Although the tin salt and sulfur are usually added to the solvent simultaneously prior to heating, this is not the only feasible procedure. For example, films are produced when either or both components are added to an already hot solution. This tends to minimize premature formation of above-solution deposits with T<90° C. No film, either above or below solution, is formed unless both Sn(II) and elemental sulfur are present; hence, a late addition of one to a hot solution containing the other can also be used as a "trigger" to the process. For example, a propionic acid solution containing only sulfur can be heated to T>90° C. T>110° C. melts sulfur and greatly increases its rate of dissolution. A separate propionic acid solution of $SnCl_2$ at the same temperature can then be added. An immediate and robust reaction will occur and produce brown deposits above and below the solution. If either solution contains water, the below-solution films will be black. If the SnCl$_2$ solution contains complexing agents, the reaction will not be as brisk and the below-solution films will be yellower. Alternately, one of the solutions could be colder than the other and when the temperature of the mixture reached 90° C., again the reactions would be triggered.

The reducing characteristics of Sn(II) also should produce reduction and incorporation of trace amounts of other elements into the deposit. Although having negligible effect upon the gross composition of the deposit, these elements could have dramatic effects upon the electrical, optical, and structural characteristics of the deposit as is a standard phenomenom in doping of semiconductors (e.g. B in Si) and inclusion of trace metals in alloys (e.g. Mn, V in steel). For example, in the case of copper, one or both of the following mechanisms might apply $$Sn^{++} + Cu^{++} = Sn(IV) + Cu$$

$$_xCu + S = Cu_xS, \text{ or}$$

$$Sn^{++} + S_x^= = Sn(IV) + S_x^=$$

$$S_x^= + Cu^{++} = CuS + S_{x-1}.$$

In both cases, Cu$_x$S would be incorporated in trace amounts in the deposit, even though most of the Cu$_x$S would occur within the solution.

For example, we have found that trace (~10 mg/100 ml) of CuCl$_2$ or CuNa$_2$ EDTA added to the Sn(II), S, acid bath (with or without H$_2$O) produces a deposit slightly smoother/adherent and yellower than without Cu, presumably due to small amount of Cu$_x$S in the deposit. The following example exemplifies this process and is for illustration purposes only.

EXAMPLE B

1. A pure propionic acid solution 0.3M in SnCl$_2$ is stirred rapidly and heated. When T=106° C., sulfur, with a weight equivalent to 0.3M, is added.

2. The SnCl$_2$ browns quickly and a few mg of CuCl$_2$ is added.

3. After another minute, T=110° C. and solution is very brown. The above solution vapor deposition is forming.

4. After another 5 minutes, T=117° C. and a below-solution deposit is visible on an immersed glass slide. The color of the solution is extremely dark brown.

Upon removal of slide and water rinsing, a uniform, smooth, and transparent yellowish-brown film is noted below the solution. The beaker walls above solution are brown. The shade of yellow is obviously different than that of pure SnS$_{2-x}$ grown without Cu.

The below-solution electroless deposits begin to form simultaneously with the bath color change between 90° and 100° C., are existent within 5 minutes, and reach close to their maximum thickness usually within 15-30 minutes of the color change. It has been observed, however, that a small additional thickness may be added if the films are left in the cooling to room temperature solution for several hours to days, presumably due to surface nucleation of the residual Sn(II), S in the solution and/or the Sn(II), S= produced by the minor amount of dissolution of the Sn$_x$S in-solution precipitate. Prolonged immersion also increases the smoothness and uniformity of the films. Evidently, defects, irregularities, and outcroppings on the film surface preferentially dissolve due to the large surface area in contact with the solution and when the solubility product (very small but nonzero) of Sn$_x$S is exceeded, Sn(II) and S= renucleate on the film surface in a much smoother form. The net effect is transport of Sn$_x$S from areas of high surface area to areas of lower surface area. In principle, Sn$_x$S powder (e.g. our precipitate) could be added to a mixed organic acid/H$_2$O solution and with sufficient time (and possibly mild heating and stirring) would be transported via very slow dissolution, diffusion, and renucleation onto the substrates and beaker walls. Because of this smoothing effect, the standard experimental procedure is to raise the substrates within 30 minutes of the color change to verify the existence of below-solution deposit, but leave the substrates immersed for up to 4 days before final removal.

The electroless (chemical bath) method of depositing tin sulfide semiconducting films on either conductive or nonconductive substrates improves on the prior art techniques. The method of the present invention requires no separate reducing agents such as hydrazine (N$_2$H$_4$) because the tin (II) ions serve both as the metal source and the reducing agent. The present invention uses only a nontoxic and inexpensive elemental yellow sulfur that dissolves in the organic acid in molecular rather than ionic form, thus avoiding the need for an anionic sulfur species such as thiourea. The organic acid provides a large elemental sulfur solubility not found in aqueous solutions and which simultaneously provides a sufficiently low pH that the Sn(II) ions are relatively free in the absence of any deliberately added complexing agents, leading to rapid deposition times as low as 5 minutes and deposition thickness of 10's of microns. The chemical bath of the present invention is nontoxic and is temperature activated at relatively low temperatures. The apparatus required to practice the present invention is relatively simple and readily available, including beaker, stirring bar, thermometer, and stirring hot plate, rather than the sophisticated and elaborate equipment required for the prior art processes which involved high temperatures, high vacuums, toxic and expensive non-metal compounds, and in which pH control was critical.

In practicing the invention, the chemical bath without water yields a thin brown Sn$_2$S$_3$ deposit. Very small amounts of water (approximately 1–10 ml=in≈100 ml acid, ≦10%) yields a thick black-gray SnS deposit. Large amounts of water tend to yield thick brown Sn$_2$S$_3$ films. The presence of Sn$^{++}$ complexing agents, for example, potassium gluconate, slow the rate of S($-$II) formation and subsequent combination with Sn(II) and Sn(IV) and causes a slower deposition of a thin (≦1μm) amber (yellow-brown) SnS$_{2-x}$ film. By use of a 2-stage water addition technique to the same bath, or by dipping the substrate in two different baths, one can form multiple layer structures, for example, p-SnS/n-SnS$_2$, which could serve as electronic p-n heterojunctions, solar cells, or other electrical devices. The present invention has the capability to deposit three different semiconductor compounds of similar chemical composition but substantially different electrical and optical characteristics from the same basic chemical bath type by small variations in water content or complexing agent additions.

In addition to the deposition of three tin sulfide semiconducting films on either conductive or nonconductive substrates within the chemical bath solution, the present invention has the capability of a low temperature chemical vapor deposition of SnS, $Sn_2S_3$ and $SnS_2$ thin films on either conducting or nonconducting substrates above the chemical bath solution. As practiced in this embodiment, the present invention produces through chemical vapor deposition gray-black SnS, brown $Sn_2S_3$ and golden $SnS_2$ thin films on any solid surface above the chemical bath solution described above due to reaction/disproportionation of volatile tin and sulfur species generated in-situ in the solution.

The principles involved in the application of the invention in this embodiment are basically the same as described above for the in-solution deposition with the addition that generated gaseous $H_2S$ and $SnCl_4$ vapor, as well as possible tin-sulfur organic compounds, leave the solution and condense above the solution on the cooler substrate surfaces where they react to form $Sn_xS$ films.

Example A, previously stated, also serves as an only illustrative example for the chemical vapor deposition.

The above-solution vapor deposition begins at temperatures as low as 45° C. and is quite feasible at 60° C. Thus, it is possible to perform vapor deposition without significant below-solution electroless deposition. It is difficult to perform below-solution deposition without above-solution deposition but above-solution deposition could be minimized by use of complexing agents, surface foams, or beaker evacuation/gas purging. Although water is required to produce the gray-black electroless SnS deposits, it is not required to produce the brown $Sn_2S_3$ or amber $SnS_{2-x}$ below-solution deposits. Pure organic acid solutions of Sn(II) and S without complexing agents or water yield thick, uniform, adherent chocolate-brown $Sn_2S_3$ deposits both above and below the solution-air interface. Pure acid solutions of Sn(II), S and complexing agents such as gluconate, tartrate, or EDTA, but not water, produce still uniform and adherent but thinner and yellower $SnS_{2-x}$ films below the solution and thinner chocolate-brown $Sn_2S_3$ films above the solution. Trace amounts of water yield gray-black SnS below-solution deposits and predominately brown $Sn_2S_3$ above-solution deposits. Larger amounts of water tend to yield a mixed brown-black below-solution deposit and a mosiac mixture of brown, black, and golden ($SnS_2$) above-solution deposits. The complexing agents are more effective in the presence of water; i.e. have a more dramatic effect in slowing the rate of deposition and yielding thinner, yellower films, presumably because of the larger number of free $Sn^{++}$ ions, released from $SnCl_2$ in the water environment, which are immediately tied up by the complexing agents and hinder $SnCl_4$ vapor and subsequent free $Sn^{++}$ ion formation.

The present invention when used as a low temperature chemical vapor deposition technique possesses key advantages over prior art chemical deposition techniques which require bottled gases, reaction chambers, high temperatures, and inert gas atmospheres. Advantages of the present method are low temperature deposition of the three tin sulfide compounds directly above the solution and in-situ generation of the volatile gas species from reaction of solid and liquid chemicals rather than by use of expensive and hazardous bottled gas. The present invention is operable in air and normal atmospheric pressure, and is extremely simple, inexpensive and safe. The present invention has the capability of growing all three stable $Sn_xS$ phases; while the brown $Sn_2S_3$ is the predominant phase, the black SnS and golden $SnS_2$ also may be produced by use of water.

The current application of the present invention generates the volatile tin and sulfur species (probably $H_2S$ and $SnCl_4$ vapors) in-situ in solution from the tin chloride-sulfur-organic acid-water bath described above. Thus, safety precautions are much less stringent and reagent costs are much less. Application of the invention may involve (but doesn't require) a normal fume hood or exhaust fan because the great majority of $H_2S$ formed is substantially simultaneously transformed to $Sn_xS$ on the substrates and solid surfaces in-solution and above-solution and therefore doesn't escape. The $SnCl_4$ vapor is only mildly toxic, although it is corrosive. The invention in the chemical vapor deposition mode is operable at temperatures under 100° C., at atmospheric pressures and in a normal air atmosphere. The low substrate temperatures preclude SnO or $SnO_2$ formation. The thin film formation is produced by the reaction of volatile and sulfur species on the substrate and container walls above the solution, and, to a lesser extent, by the transport and subsequent reaction of the $SnCl_2$ and sulfur above the solution due to water and acid vapor. This reaction evidently requires a low temperature (45°–100° C.) to activate. The simplicity of the apparatus and chemicals involved in the low temperature vapor deposition technique leads to a very inexpensive system. The tolerance of the system to broad chemical concentration changes leads to easy deposition.

In accordance with the present invention, a simple, nontoxic and inexpensive method of producing multiple layers of various semiconducting tin sulfide compounds on themselves, or on other prior semiconducting layers, or metals specifically includes the growth of electronic junctions such as Sn/p-SnS, p-SnS/$Sn_2S_3$, and/or p-SnS/n-$SnS_{2-x}$ layers deposited by a low temperature chemical bath (electroless) or chemical vapor deposition from baths of Sn(II), sulfur, organic acid and water.

Prior techniques for the production of multiple layers of semiconducting films require very expensive equipment capable of handling high temperatures, high vacuums, and hazardous chemicals. Many of the techniques require very toxic and expensive gases and most require the use of extremely controlled impurities (homojunction) or the use of two different compound families (heterojunctions) which may tend to alloy and form poorly defined interfaces. In distinction, the present invention is operable at temperatures below 100° C., at atmospheric pressure and in normal atmospheric conditions. The apparatus required is extremely simple and inexpensive. The reactant gases are generated in-situ from reaction of inexpensive and relatively non-toxic liquid and solid chemicals. The present invention allows the above-solution and below-solution deposition of the three tin sulfide compounds (SnS, $Sn_2S_3$, and $SnS_2$) and, thus, layered structures from the same or sequential baths by variation in experimental conditions such as concentration of ingredients, pH control, and heating cycle.

Additionally, the three semiconducting tin sulfide compounds have different electrical and optical properties. For example, SnS is gray-black with a bandgap near 1.3 eV and is p-type; $Sn_2S_3$ is brown with a bandgap near 1.6 eV and is weakly n-type; and $SnS_2$ is golden-yellow to amber with a bandgap near 2.1 eV and is n-type. All three bandgaps are in or very near the visible range and are conducive to photovoltaic applications. The existence of opposite conductivity types leads to easy fabrication of p-n heterojunctions (p-SnS/n-SnS$_2$ or p-SnS/n-Sn$_2$S$_3$), from the same or sequential baths through appropriate variations in the process conditions. Further, the fabrication of Sn$_x$S/metal Schottky Barriers is also easy to perform. All of these devices have potential for solar cells and other electronic applications. Other possible multiple layer structures include optical filters, decorative coatings, and strained-layer superlattices.

It is possible that a combination of below and above solution deposition methods can be used to create the junctions. For example, the best SnS films are produced below solution and the best SnS$_2$ films are produced above the solution. A relatively crystalline and thick black SnS film could be deposited below-solution on a high work function metal (for example, Au, Ag, or Mo) to form an ohmic contact. With the addition of more SnCl$_2$, sulfur and water to the bath, more SnCl$_4$ and H$_2$S vapor would be generated, leave the solution, and react above the solution on the raised SnS film to form a golden SnS$_2$ or brown Sn$_2$S$_3$ film and, hence, a p-SnS/n-Sn$_2$S$_3$ heterojunction.

The practice of the present invention for the formation of multiple layers of tin sulfide semiconducting films involves (1) either two separate additions of the Sn(II) salt, sulfur and water, or the raising/lowering of the substrate just prior to the second addition, but only when both the in-solution and above-solution deposition techniques are used; or (2) moving of the substrate from a first chemical bath container where the first film was formed (either above or below solution), to a second bath container where a second film (either above or below solution) would be formed.

It is possible to form the multiple layer structure from the same bath with no new chemical additions. For example, brown Sn$_2$S$_3$ normally forms above the solution near 60° C. from a bath with no or little water. This film could be formed on a metal substrate via very slow heating and then immersed into the solution. Near 90° C., a black SnS film could be grown below the solution yielding a n-Sn$_2$S$_3$/p-SnS heterojunction.

The application of the present invention to produce multiple layers of semiconducting tin sulfide compounds has many potential applications.

The Sn$_x$S system has three stable semiconductor compounds (p-SnS (Eg=1.3 eV), n-Sn$_2$S$_3$ (Eg≈1.6 eV), n-SnS$_2$ (Eg=2.1 ev)) with different optical and electrical properties. Thus, electronic applications could be developed analogously to those of Cu$_2$S, CdS and ZnS (photosensitivity/luminescence). The SnS films are moderately photoconductive. One potential use is the fabrication and development of a n-SnS$_2$/p-SnS hetero-p-n junction as an alternate to the n-CdS/p-Cu$_2$S junction currently used in solar cells. The fact that both compounds contain the same elements would minimize impurity problems associated with atom diffusion across the junctions and permit the direct fabrication of the junctions from the same bath in two consecutive steps.

The amber SnS$_{2-x}$ to golden SnS$_2$ films are attractive, durable, and uniform and can serve as good decorative coatings on metal, glass or plastic (e.g. inside of a light bulb). The fact that these films are deposited by a chemical, rather than an electrochemical, process allows deposition on any substrate not seriously attacked by the solution. The brown Sn$_2$S$_3$ and gray-black SnS could also be used for decorative coatings.

The gray-black SnS has an anomalously large infrared absorbance not exhibited by SnS films grown at higher temperatures. Furthermore, it has a low reflectance. These properties would allow it to serve as a heat absorber in solar-thermal applications.

These materials could serve as attractive protective coatings on metals when of low porosity and resistant to atmosphere chemical changes.

Sn$_x$S films deposited in inert substrates such as glass, Teflon, graphite, or titanium could serve as anodes or cathodes in batteries, similarly to how FeS$_2$ and CuS are now being used in new battery investigations.

Due to the great sensitivity of the optical and electrical properties of the Sn$_x$S film to minor deviations in x between 1 and ½, these films could be used as transducers in sulfur or tin compound (H$_2$S, SnCo$_4$, etc.) detectors.

The following three (3) examples serve to illustrate preferred embodiments of the inventive method and are not intended to limit the teachings as set forth herein.

EXAMPLE I

Three precleaned and dried glass slides were immersed in ≈100 ml of propionic acid (reagent grade-Alfa Chemical, Danvers, Mass.) 0.3M in both SnCl$_2$ and yellow, elemental sulfur (both initially undissolved) and containing approximately 1:100 parts deionized water. Upon rapid heating and stirring the following observations were made:

1. After 2 minutes, T=70° C. and the solutes were beginning to dissolve. The bottom region of the beaker began to turn black.

2. After 4 minutes, T=90° C. and the bottom half of the solution was getting blacker. Dark brown above-solution chemical vapor deposits formed ½ inch above the solution-air interface and spread upward.

3. After 6 minutes, T=103° C. and the solution was near boiling. Considerable black precipitate appeared within the solution and the entire solution became a brownish-black color. The stirring bar was turned off and the heat slightly reduced. A larger brown (Sn$_2$S$_3$) area of vapor deposit existed ½ inch above the solution around the entire perimeter of the beaker wall and on the slides.

4. After 8 minutes, T=100° C. and the solution was black/brown and opaque. The vapor deposition spread upward on the beaker wall and slides.

5. After 30 minutes, T=80° C. The electroless, below-solution deposits on the beaker walls and slides were becoming black and thick. The vapor deposits were dark brown and nearly opaque. The heater was turned off.

Upon removing the slides and rinsing/soaking them in deionized water, the below-solution deposits were observed to be smooth, uniform, gray, and totally opaque and the above-solution deposits dark brown but still transparent. The beaker walls were also opaque black below the interface and brown above it. The below-solutions films were found, via X-ray microanalysis, to have a Sn:S ratio near 1:1 and the above-solution films near 2:3. The gray below-solution films exhibited a strong SnS X-ray diffraction peak structure while the brown above-solution deposits exhibited mixed Sn$_2$S$_3$/SnS$_2$ structures.

EXAMPLE II

1. L-tartaric acid, SnCl$_2$, and yellow sulfur were added to pure propionic acid in weights equivalent to 0.1M, 0.3M, and 0.3M, respectively. The solution was then rapidly heated and stirred after immersion of glass sides.

2. After 4 minutes, T=99° C. and the solution was beginning to boil. The bottom of the solution darkened and the sulfur began to melt on the beaker floor.

3. After 7 minutes, T=115° C., and the stirring was ceased. The solution exhibited a light-yellow (straw-like) color.

4. After 9 minutes, the heater was turned down.

5. After 25 minutes, T=110° C. and the solution was a cloudy yellow-brown color.

6. After 30 minutes, the solution was cloudier and still yellowish-brown. There was no vapor deposit above the solution. Residual, undissolved solutes appeared black.

7. After 40 minutes, T=110° C., and the solution was a nearly opaque yellow-brown color.

8. After 45 minutes, T=110° C. and the solution was totally brown. A very thin brown vapor deposit appeared 1 inch above the solution-air interface.

9. After 65 minutes, T=110° C. and the heat was turned off. More above-solution deposit formed.

Upon removing and rinsing the slides, the below-solution deposits were yellow-brown (straw colored) ($\frac{1}{2}<$Sn:S$<\frac{2}{3}$) and relatively thin with a few black crystals (SnS) appearing on the surface. Interference effects imparted a greenish cast to the below-solution deposits. The above-solution deposits were brown ($Sn_2S_3$). Evidently, the tartaric acid (as does potassium gluconate) complexed the $Sn^{++}$ ions and greatly reduced the rate at which they could reduce S to and precipitate with $H_2S$, $HS^-$, or $S_x^=$, and hence nucleate a film out on the immersed substrates.

EXAMPLE III

1. A pure (glacial) acetic acid (regent grade-Alfa Chemicals, Danvers, Mass.) solution with added $SnCl_2$ and yellow sulfur weights (initially undissolved) equivalent to 0.3M (both) was rapidly heated and stirred after immersion of glass slides.

2. After 2 minutes, T=52° C., and sulfur grains were blackening.

3. After 4 minutes, T=71° C., and brown specks formed on the beaker walls.

4. After 5 minutes, T=75° C., and the stirring was ceased. Above-solution chemical vapor deposition appeared.

5. After 10 minutes, T=88° C., and the undissolved solutes and bottom of the solution were turning black.

6. After 14 minutes, T=93° C., and the solution rapidly turned dark brown. The submerged beaker walls were being coated with a uniform brown deposit.

7. After 16 minutes, T=95° C., and the solution was a nearly opaque, dark brown/black color.

8. After 19 minutes, T=96° C., and deposition seemed to have ceased.

Upon removing and rinsing the slides, the below-solution deposits were uniform, thick, and dark brown ($Sn_2S_3$) with a few black patches. The above-solution deposit was thinner and brownish-black.

While this invention has been described in connection with certain embodiments thereof, it is to be understood that this is by way of illustration and not by way of limitations; and the scope of the appended claims should be construed as broadly as the prior art will permit.

What is claimed is:

1. A process for the electroless and chemical vapor deposition of tin sulfide on a conductive or nonconductive substrate comprising the steps of:
    a. Preparing a chemical bath solution comprising a stannous salt, elemental yellow sulfur, and an organic acid;
    b. Heating said solution, and then either removing or maintaining the heat source; and
    c. Placing said substrate within or above said solution to form on said substrate a $Sn_xS$ ($0.5 \leq x \leq 1$) film.

2. The process as defined in claim 1 wherein said solution is heated to a temperature between 60° and 150° C. before the heat is turned off, down, or held constant.

3. The process as defined in claim 1 wherein said organic acid is selected from the group consisting of acetic, propionic or butyric acid.

4. The process as defined in claim 1 wherein the stannous salt comprises stannous chloride in a concentration of 0.01-1M and said elemental sulfur is present in molecular form in the range of 0.01M to saturation.

5. The process as defined in claim 1 wherein said solution further comprises a Sn(II) complexing agent and/or an inert, organic solvent such as glycol, added to increase pH without a substantial decrease in sulfur solubility.

6. The process as defined in claim 1 further comprising the steps of placing and moving said substrate wherein said substrate is positioned above said solution, or partially above and partially within said solution, or initially above and subsequently within said solution, or initially below and subsequently above said solution to deposit onto a single substrate single phase $Sn_xS$ films or multiple layer or region tin sulfide thin film structures, notably $pSnS/n-SnS_2$ or $p-SnS/n-Sn_2S_3$ heterojunctions or metal/$Sn_xS$ Schottky Barriers.

7. The process as defined in claim 1 wherein $Sn_xS$ films $>1\mu m$ thick are produced within 15 minutes of initial heating.

8. The process as defined in claim 1 wherein said tin sulfide film comprises a SnS gray-black tin sulfide compound, a $Sn_2S_3$ brown tin sulfide compound, or a $SnS_{2-x}$ amber tin sulfide compound.

9. The process as defined in claim 1 wherein said $Sn_xS$ films are nonamorphous and polycrystalline, and have grain sizes of order of 1 $\mu m$.

10. The process as defined in claim 1 further comprising reduceable metal ions such as Cu(II) added during preparation or heating, and incorporated into the $Sn_xS$ deposit via reduction/reaction with sulfur, or precipitation with generated $S_x^=$.

11. The process as defined in claim 1 wherein initial irregularities, surface defects and outcroppings on the (below-solution) $Sn_xS$ films are reduced by prolonged immersion in the same bath from which deposition occurred by preferential dissolution, diffusion, and renucleation/precipitation of Sn(II, IV) and S(−II) on solid surfaces.

12. A process for the electroless and chemical vapor deposition of tin sulfide on a conductive or nonconductive substrate comprising the steps of:
    a. Preparing a chemical bath solution comprising a stannous salt, elemental yellow sulfur, an organic acid (50%–100%), and water (50%–<0.1%);
    b. Heating said solution, and then either removing or maintaining the heat source; and
    c. Placing said substrate within or above said solution to form on said substrate a $Sn_xS$ ($0.5 \leq x \leq 1$) film.

13. The process as defined in claim 12 wherein said solution is heated to a temperature between 60° and 150° C. before the heat is turned off, down, or held constant.

14. The process as defined in claim 12 wherein said organic acid is selected from the group consisting of acetic, propionic or butyric acid.

15. The process as defined in claim 12 wherein the stannous salt comprises stannous chloride in a concentration of 0.01–1M and the elemental sulfur powder is present in molecular form in a range of 0.01M to saturation.

16. The process as defined in claim 12 wherein said solution further comprises a complexing agent, and/or a relatively inert, nonacidic organic, solvent such as glycol, added to increase pH without a substantial decrease in sulfur solubility.

17. The process as defined in claim 12 further comprising the steps of placing and moving said substrate whereby said substrate is positioned above said solution, or partially above and partially within said solution, or initially above and subsequently within said solution, or initially below and subsequently above said solution to deposit onto a single substrate, single phase $Sn_xS$ films or multiple layer or region tin sulfide thin film structures, notably p-SnS/n-$SnS_2$ or p-SnS/n-$Sn_2S_3$ heterojunctions or metal/$Fn_xS$ Schottky Barriers.

18. The process as defined in claim 12 wherein $Sn_xS$ films >1 μm thick are produced within 15 minutes of initial heating.

19. The process as defined in claim 12 wherein the tin sulfide film comprises a SnS gray-black tin sulfide compound, a $Sn_2S_3$ brown tin sulfide compound, or $SnS_{2-x}$ amber tin sulfide compound.

20. The process as defined in claim 12 wherein said $Sn_xS$ films are nonamorphous and polycrystalline, and have grain sizes of order of 1 μm.

21. The process as defined in claim 12 further comprising reduceable metal ions such Cu(II) added during preparation or heating, and incorporated into the $Sn_xS$ deposit via reduction/reaction with sulfur, or precipitation with generated $S_x^=$.

22. The process as defined in claim 12 where initial irregularities, surface defects and outcroppings on the (below-solution) $Sn_xS$ films are reduced by prolonged immersion in the same bath from which deposition occurred by preferential dissolution, diffusion, and renucleation/precipitation of Sn(II, IV) and S(−II) on solid surfaces.

* * * * *